(12) United States Patent
Yamauchi et al.

(10) Patent No.: US 6,339,355 B1
(45) Date of Patent: Jan. 15, 2002

(54) OFFSETTING COMPARATOR DEVICE AND COMPARATOR CIRCUIT

(75) Inventors: Hiroyuki Yamauchi; Yutaka Terada, both of Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/461,381

(22) Filed: Dec. 15, 1999

(30) Foreign Application Priority Data

Dec. 16, 1998 (JP) ............................................. 10-357236

(51) Int. Cl.$^7$ ................................................ H03L 5/00
(52) U.S. Cl. ......................... 327/307; 327/103; 327/65; 327/563; 327/53
(58) Field of Search ................................ 327/103, 307, 327/65, 68, 69, 563, 52, 53; 330/252, 258, 253

(56) References Cited

U.S. PATENT DOCUMENTS

| | | | |
|---|---|---|---|
| 3,582,802 A | * 6/1971 | Weekes et al. | ............... 330/258 |
| 4,723,110 A | * 2/1988 | Voorman | ................... 330/258 |
| 4,766,394 A | * 8/1988 | Yukawa | ..................... 330/258 |
| 4,797,586 A | * 1/1989 | Traa | ............................ 327/276 |
| 4,797,631 A | * 1/1989 | Hsu et al. | ................... 330/258 |
| 4,868,417 A | * 9/1989 | Jandu | .......................... 327/65 |
| 5,371,474 A | * 12/1994 | Wassenaar et al. | ......... 330/258 |
| 5,424,657 A | 6/1995 | Van Brunt et al. | ............ 326/63 |
| 5,517,134 A | * 5/1996 | Yaklin | .......................... 327/65 |
| 5,608,352 A | * 3/1997 | Itakura | ....................... 330/252 |
| 5,764,086 A | * 6/1998 | Nagamatsu et al. | .......... 327/65 |
| 5,880,634 A | * 3/1999 | Babanezhad | ................ 330/126 |
| 6,049,229 A | * 4/2000 | Manohar et al. | ............ 330/253 |
| 6,104,226 A | * 8/2000 | Weber | ........................ 327/359 |
| 6,255,863 B1 | * 7/2001 | Yamauchi et al. | ............ 327/65 |

* cited by examiner

*Primary Examiner*—Terry D. Cunningham
*Assistant Examiner*—Long Nguyen
(74) *Attorney, Agent, or Firm*—McDermott, Will & Emery

(57) ABSTRACT

An offsetting comparator device includes master and slave comparator circuits and a reference differential voltage generator. The master comparator circuit supplies a sensed current corresponding to a potential difference represented by a differential signal on a transmission line. The reference differential voltage generator generates a reference differential voltage based on an intermediate potential of the differential signal. And the slave comparator circuit supplies a current corresponding to the potential difference as offset current. The offsetting comparator device outputs a differential current between the sensed and offset currents and therefore shows an offset in its input/output characteristics. The master and slave comparator circuits have the same circuit configuration. Thus, if the characteristic of the sensed current output from the master comparator circuit has changed due to a potential level variation of the differential signal, then the characteristic of the offset current also changes similarly. Thus, the offsetting comparator device can obtain a constant offset voltage even if the potential level of the differential signal has changed.

2 Claims, 21 Drawing Sheets

(PRIOR ART)

Potential Difference of Differential Signal

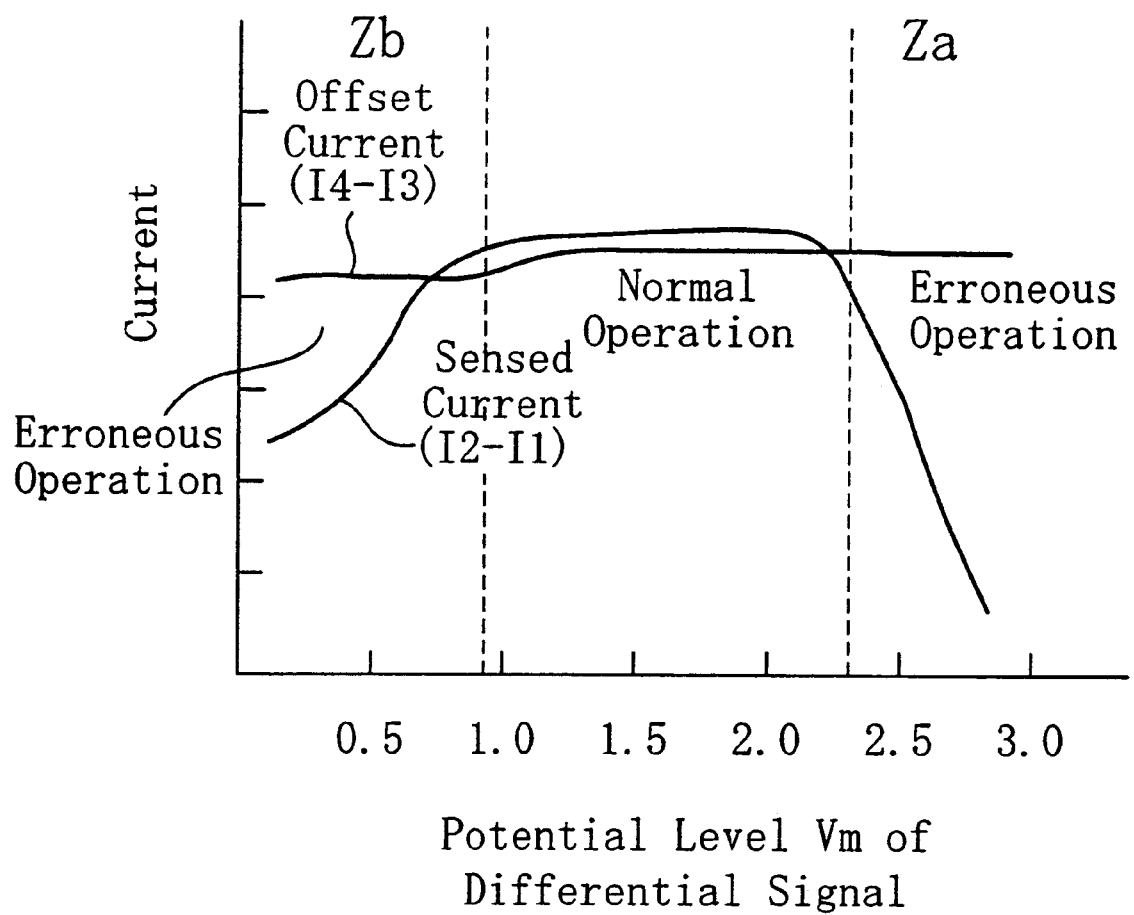

OFFSETTING COMPARATOR DEVICE AND COMPARATOR CIRCUIT

BACKGROUND OF THE INVENTION

The present invention generally relates to an offsetting comparator device for use in tristate level determination of a differential signal, i.e., which of the three conditions "0", "1" and "Z" the signal assumes, for data communications purposes and so on. More particularly, the present invention relates to a technique of stabilizing the operation of the comparator device against a potential variation of the differential signal.

In a communications network, when the level of a differential signal should be determined as "0", "1" or "Z", an offsetting comparator device is used to see if the potential difference of the differential signal has exceeded an offset voltage.

FIG. 19 illustrates a tristate level determination of a differential signal in compliance with the IEEE 1394 standard. As illustrated in FIG. 19, the level of the differential signal is determined as "1" when the potential difference thereof is larger than 165 mV; "0" when the difference is smaller than −165 mV; and "Z" when the difference is in the range from −165 to 165 mV, both inclusive. Such a tristate level determination can be performed by connecting together a pair of comparator devices with an offset voltage of 165 mV and applying a voltage represented by the differential signal to the inverting input terminal of one of these comparator devices and to the non-inverting input terminal of the other.

FIG. 20 is a circuit diagram illustrating a conventional offsetting comparator device. In FIG. 20, a pair of p-channel transistors, which receive a differential input (C, D) with a fixed potential and supply currents I3 and I4, respectively, is connected in parallel to another pair of p-channel transistors, which receive a differential input (A, B) and supply currents I1 and I2, respectively. These currents I1, I2, I3 and I4 are combined at an output node so that a difference {(I2−I1)−(I4−I3)} between a sensed current corresponding to the potential difference represented by the differential input (A, B), i.e., (I2−I1), and an offset current, i.e., (I4−I3), is provided as output current to an external component. The potential difference of the differential input (A, B) when the sensed current (I2−I1) is canceled by the offset current (I4−I3) to bring the output current to zero is defined as "offset voltage".

The known offsetting comparator device, however, has the following drawbacks.

FIG. 21 is a graph illustrating a relationship between an intermediate potential Vm of the differential input (A, B) and the magnitude of the current in the circuit shown in FIG. 20. In FIG. 21, the potential difference represented by the differential input (A, B) is supposed to be constant and the potential represented by the differential input (C, D) is fixed as described above. Thus, the magnitudes of the currents I3 and I4 are kept substantially constant irrespective of the potential represented by the differential input (A, B), and therefore the offset current (I4−I3) is also substantially constant as shown in FIG. 21.

However, even if the potential difference represented by the differential input (A, B) is constant, the magnitudes of the currents I1 and I2 are changeable with the potential variation. In Zone Za where the potential is larger than a potential obtained by subtracting a saturated drain-source voltage of the p-channel transistor from a supply potential, the magnitudes of the currents I1 and I2 are greatly variable with the potential represented by the differential input (A, B). In Zone Zb on the other hand, the transistors receiving the differential input (A, B) are not operable in their saturated regions anymore, but operate in a linear region. As a result, the sensitivity deteriorates, i.e., the sensed current (I2−I1) decreases. Thus, the offset voltage, i.e., the potential difference represented by the differential input (A, B) when the sensed current (I2−I1) is canceled by the offset current (I4−I3), is also greatly changeable with the potential represented by the differential input (A, B).

In general, the center potential of a differential signal is greatly changeable between a ground potential and a supply potential. Thus, an offsetting comparator device should always provide a constant offset voltage no matter where the center potential of the differential input is located within the range from the ground to supply potentials. Thus, if the offset voltage is greatly variable with the potential represented by the differential input as in Zones Za and Zb in FIG. 21, then serious problems are caused.

In addition, the characteristics of transistors included in the circuit are supposed to be non-changeable in the example illustrated in FIG. 21. Actually, though, the transistor characteristics might be affected by supply voltage, temperature or process conditions. Thus, the relationship between the offset current (I4−I3) and sensed current (I2−I1) is even more complicated, thus further lowering the stability of the offset voltage.

According to a conventional technique, a level shifter is provided as preceding stage of the comparator to reduce the range of the potential supplied to the comparator to at least about a half of the supply voltage (see U.S. Pat. No. 5,424,657, for example). In such a configuration, if the differential input potential is higher than the center potential of the supply voltage, then the input potential is provided to the comparator after having been lowered by the level shifter. Alternatively, if the differential input potential is lower than the center potential of the supply voltage, then the input potential is provided to the comparator as it is. As a result, the variation range of the differential input potential is in effect one half of the supply voltage.

According to this configuration, however, just of Zones Za and Zb shown in FIG. 21 can be eliminated and the problem cannot be solved radically. Also, if the differential input potential is changed by the level shifter, then the potential difference also increases albeit slightly, thus adversely affecting the stability of the offset voltage.

SUMMARY OF THE INVENTION

An object of the present invention is providing an offsetting comparator device that can obtain a constant offset voltage in spite of a potential variation of a differential signal.

Specifically, an offsetting comparator device according to the present invention determines whether or not a potential difference represented by a differential signal has exceeded an offset voltage. The device includes: a master comparator circuit, which receives the differential signal as differential input and supplies a sensed current corresponding to the potential difference represented by the differential input; and means for supplying an offset current. The device outputs a current representing a difference between the sensed and offset currents. The offset current supply means controls the magnitude of the offset current based on the potential level of the differential signal so as to stabilize the offset voltage.

According to the present invention, the magnitude of the offset current is controlled by the offset current supply means based on the potential level of the differential signal. Thus, even if the relationship between the potential difference represented by the differential input (or differential signal) and the sensed current has changed due to the potential variation of the differential signal, the magnitude of the offset current is controlled based on the potential represented by the differential signal. Accordingly, the offset voltage, which is a potential difference represented by the differential input when the sensed current is canceled by the offset current, does not change. As a result, a constant offset voltage can be obtained even if the potential represented by the differential signal has changed.

In one embodiment of the present invention, the offset current supply means preferably includes: a reference differential voltage generator, which receives an intermediate potential represented by the differential signal as input and outputs a reference differential voltage corresponding to the intermediate potential; and a slave comparator circuit, which receives the reference differential voltage as another differential input and outputs a current corresponding to the potential difference as the offset current. The slave comparator circuit has the same configuration as the master comparator circuit.

In this particular embodiment, each of the master and slave comparator circuits preferably receives the associated differential input at respective parallel gates of p- and n-channel transistors.

In an alternate embodiment, each of the master and slave comparator circuits may include: a first pair of transistors of one conductivity type, which receive the differential input; a second pair of transistors of the other conductivity type, which receive the differential input; and a third pair of transistors of the one conductivity type, through which a current, corresponding to the current flowing through the second pair of transistors, flows by way of a current mirror. Each said comparator circuit outputs a sum of differential currents of the first and third pairs of transistors. A current is supplied from a common constant current source to the first and third pairs of transistors.

In still another embodiment, the reference differential voltage generator may include: a potential generator, which includes a resistor and generates both potentials represented by the reference differential voltage based on the intermediate potential and a voltage drop caused by the resistor; and a current controller for controlling the amount of current flowing through the resistor such that the voltage drop caused by the resistor becomes constant.

In this particular embodiment, the potential generator preferably includes an operational amplifier, which receives the intermediate potential as one of the inputs. The resistor preferably connects the other input of the operational amplifier to the output thereof. The output of the operational amplifier is preferably output as one of the potentials represented by the reference differential voltage.

In an alternate embodiment, the potential generator may include an operational amplifier, which receives the intermediate potential as one of the inputs. The resistor may include: a first resistor connecting the other input of the operational amplifier to the output thereof; and a second resistor connected in series to the first resistor. The potential generator preferably outputs potentials at both terminals of the first and second resistors as the potentials represented by the reference differential voltage.

In still another embodiment, the potential generator may include first and second resistors connected in series to each other. The intermediate potential is applied to a connection node of the resistors. The potential generator preferably outputs potentials at both terminals of the first and second resistors as the potentials represented by the reference differential voltage.

In still another embodiment, the comparator device may further include means for delaying the differential signal for a predetermined time, which is provided on an input end of the master comparator circuit.

Another offsetting comparator device according to the present invention determines whether or not a potential difference represented by a differential signal has exceeded an offset voltage. The device includes: a master comparator circuit, which receives the differential signal as differential input and supplies a sensed current corresponding to the potential difference represented by the differential input; and a slave comparator circuit for supplying an offset current. The device outputs a current representing a difference between the sensed and offset currents. Each of the master and slave comparator circuits includes: a first pair of transistors of one conductivity type, which receive the differential input; a second pair of transistors of the other conductivity type, which receive the differential input; and a third pair of transistors of the one conductivity type, through which a current, corresponding to the current flowing through the second pair of transistors, flows by way of a current mirror. Each said comparator circuit outputs a sum of differential currents of the first and third pairs of transistors. A current is supplied from a common constant current source to the first and third pairs of transistors.

A comparator circuit according to the present invention supplies a current corresponding to a potential difference represented by a differential input. The circuit includes: a first pair of transistors of one conductivity type, which receive the differential input; a second pair of transistors of the other conductivity type, which receive the differential input; and a third pair of transistors of the one conductivity type, through which a current, corresponding to the current flowing through the second pair of transistors, flows by way of a current mirror. The circuit outputs a sum of differential currents of the first and third pairs of transistors. A current is supplied from a common constant current source to the first and third pairs of transistors.

BRIEF DESCRIPTION OF THE DRAWINGS

FIG. 2(a) is a graph illustrating a relationship between a variation in differential input potential and an offset voltage according to the present invention; and FIG. 2(b) is a graph illustrating a relationship between a variation in differential input potential and an offset voltage in the prior art.

FIG. 21 is a graph illustrating a relationship between the differential input potential and current in the circuit shown in FIG. 20.

DESCRIPTION OF THE PREFERRED EMBODIMENTS

Hereinafter, preferred embodiments of the present invention will be described with reference to the accompanying drawings.

Figure 1:
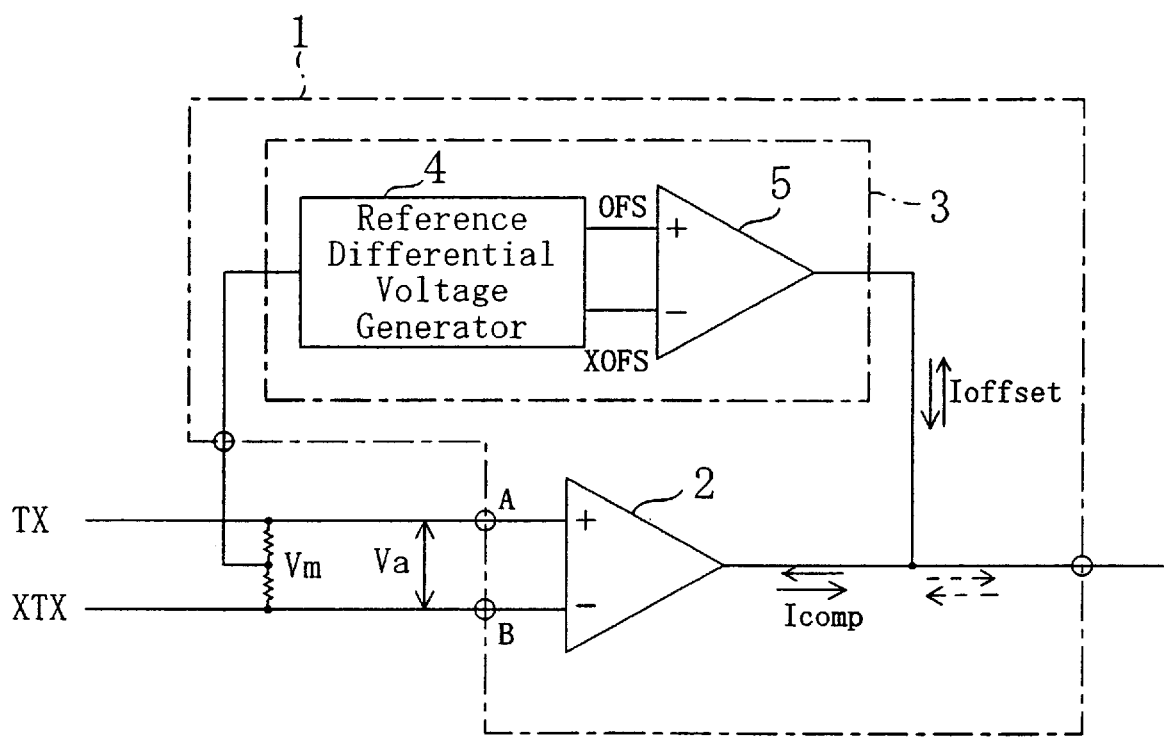
FIG. 1 illustrates a schematic configuration for an offsetting comparator device according to an exemplary embodiment of the present invention.

FIG. 1 illustrates a schematic configuration for an offsetting comparator device according to an exemplary embodiment of the present invention. The offsetting comparator device 1 shown in FIG. 1 receives a differential signal (TX, XTX) that has been transmitted through a pair of transmission lines TX and XTX. The device 1 includes a master comparator circuit 2 and offset current supply means 3 for supplying offset current Ioffset. The master comparator circuit 2 receives the differential signal (TX, XTX) and supplies a sensed current Icomp corresponding to the potential difference Va represented by the differential input (or signal). The offset current supply means 3 includes a reference differential voltage generator 4 and a slave comparator circuit 5. The reference differential voltage generator 4 receives an intermediate potential Vm represented by the differential signal (TX, XTX) and outputs a reference differential voltage (OFS, XOFS) corresponding to the intermediate potential Vm. The slave comparator circuit 5 receives the reference differential voltage (OFS, XOFS) and supplies the offset current Ioffset corresponding to the potential difference represented by the reference differential voltage (OFS, XOFS).

The intermediate potential Vm may be defined at any value so long as the potential Vm can represent the potential level of the differential signal (TX, XTX). In the illustrated embodiment, the intermediate potential Vm is supposed to be the center potential (i.e., average potential) of the differential signal (TX, XTX).

The master and slave comparator circuits 2 and 5 are connected to a common output node, through which the offsetting comparator device 1 outputs a current representing a difference between the sensed and offset currents Icomp and Ioffset. In this manner, the offsetting comparator device 1 shown in FIG. 1 shows an offset in the input/output characteristics thereof. The master and slave comparator circuits 2 and 5 have "the same" circuit configuration.

Actually, though, these comparator circuits 2 and 5 have only to have substantially the same configurations, not completely. Examples of specific requirements include that transistors of almost the same size are connected together in a similar manner to form the circuit and that the dependence on the operation specifications, potential Vm and supply voltage thereof are substantially the same.

Next, a basic technical concept of the present invention will be described with reference to FIGS. 2(a) and 2(b).

Figure 2A:
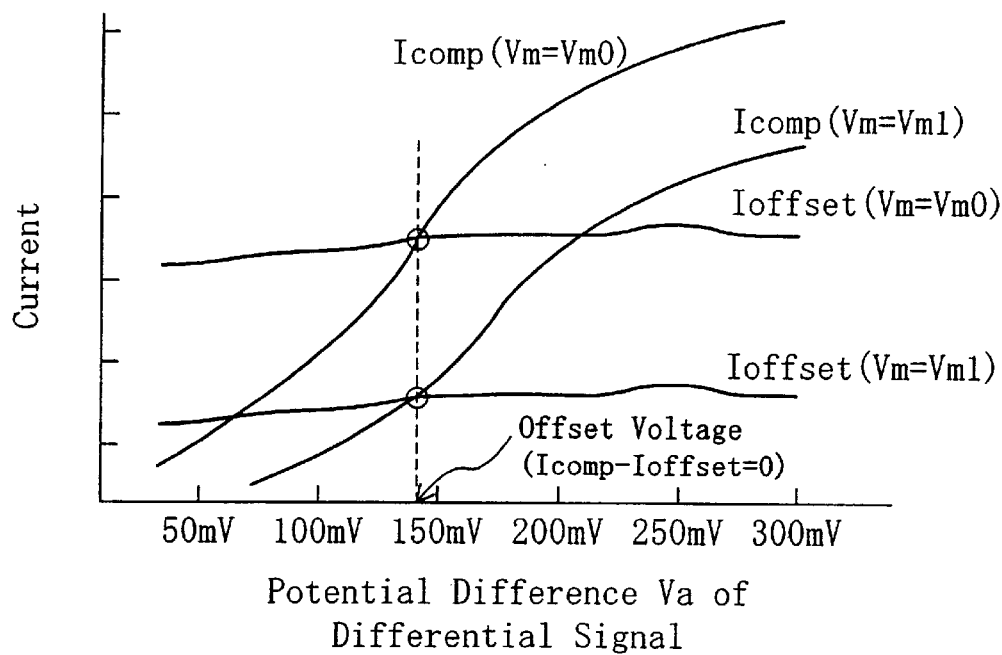
FIGS. 2(a) and 2(b) illustrate a basic technical concept of the present invention.
Figure 20:
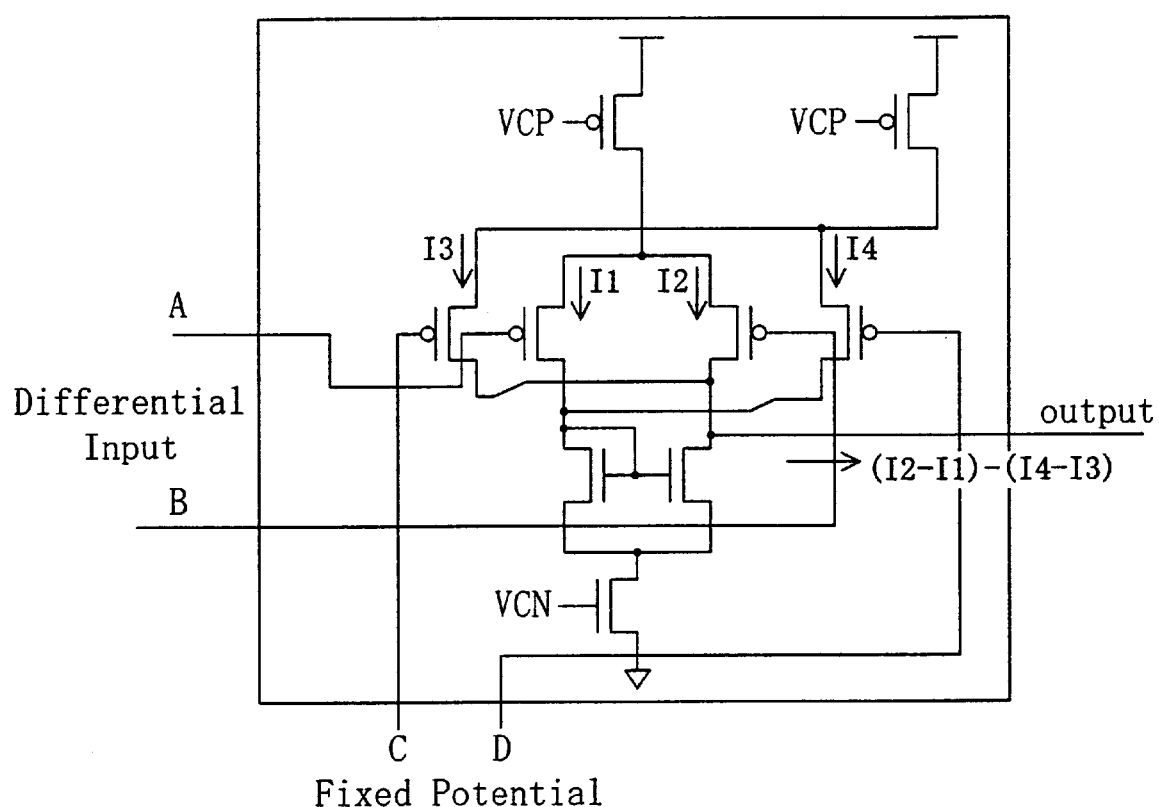
FIG. 20 illustrates a configuration for a prior art offsetting comparator device.

FIG. 2(a) is a graph illustrating relationships among the potential difference Va represented by the differential signal, sensed current Icomp and offset current Ioffset according to the present invention. The Icomp-Va characteristic curve moves up or down depending on the intermediate potential Vm represented by the differential signal (TX, XTX) when the potential Vm is within a predetermined range (e.g., in Zone Za or Zb in the graph illustrated in FIG. 20). Thus, according to the present invention, the magnitude of the offset current Ioffset is controlled depending on the potential represented by the differential signal (TX, XTX) to stabilize the offset voltage. In the configuration illustrated in FIG. 1, the reference differential voltage generator 4 monitors the intermediate potential Vm represented by the differential signal (TX, XTX) and outputs the reference differential voltage (OFS, XOFS) for generating the offset current Ioffset around the potential Vm.

Since the master and slave comparator circuits 2 and 5 have the same circuit configuration, the input/output characteristics thereof are almost the same. Accordingly, if the Icomp-Va characteristic curve moves up or down with the potential Vm, the offset current Ioffset also changes along with the potential Vm. An offset voltage is equivalent to the potential difference Va represented by the differential signal when the sensed current Icomp is equal to the offset current Ioffset. Thus, according to the present invention, the offset voltage does not change with the potential Vm but is substantially constant as shown in FIG. 2(a).

Figure 2B:
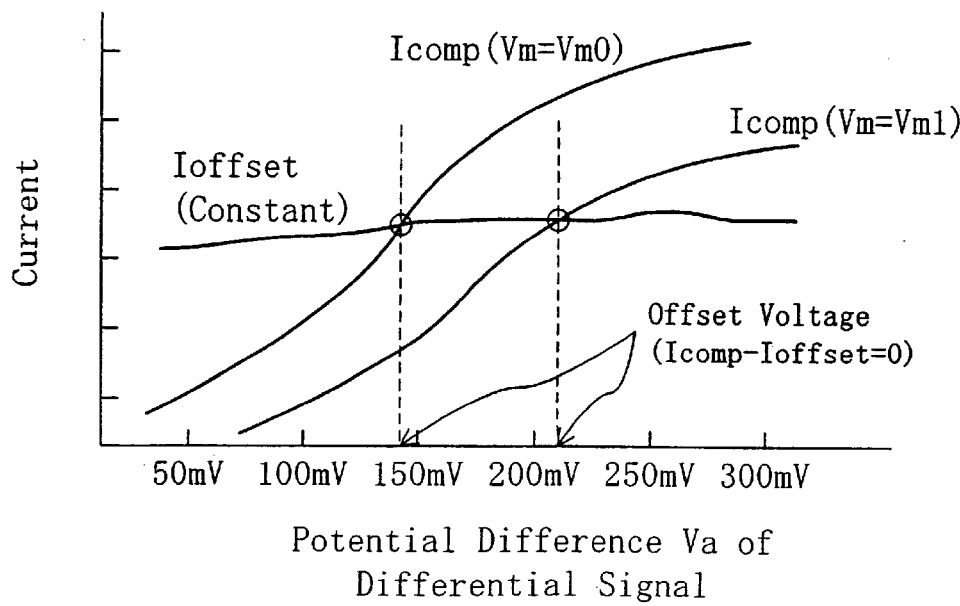

FIG. 2(b) is a graph illustrating relationships among the potential difference Va represented by the differential signal, sensed current Icomp and offset current Ioffset in the prior art. As shown in FIG. 2(b), a constant potential is applied for offsetting purposes according to the prior art and therefore, the offset current Ioffset is constant irrespective of the potential represented by the differential signal (TX, XTX). Accordingly, if the Icomp-Va characteristic curve moves up or down along with the potential Vm, then the offset voltage greatly changes correspondingly.

That is to say, according to the present invention, even if the potential represented by the differential signal has changed, the offset voltage can be advantageously kept substantially constant as opposed to the prior art.

Figure 3:
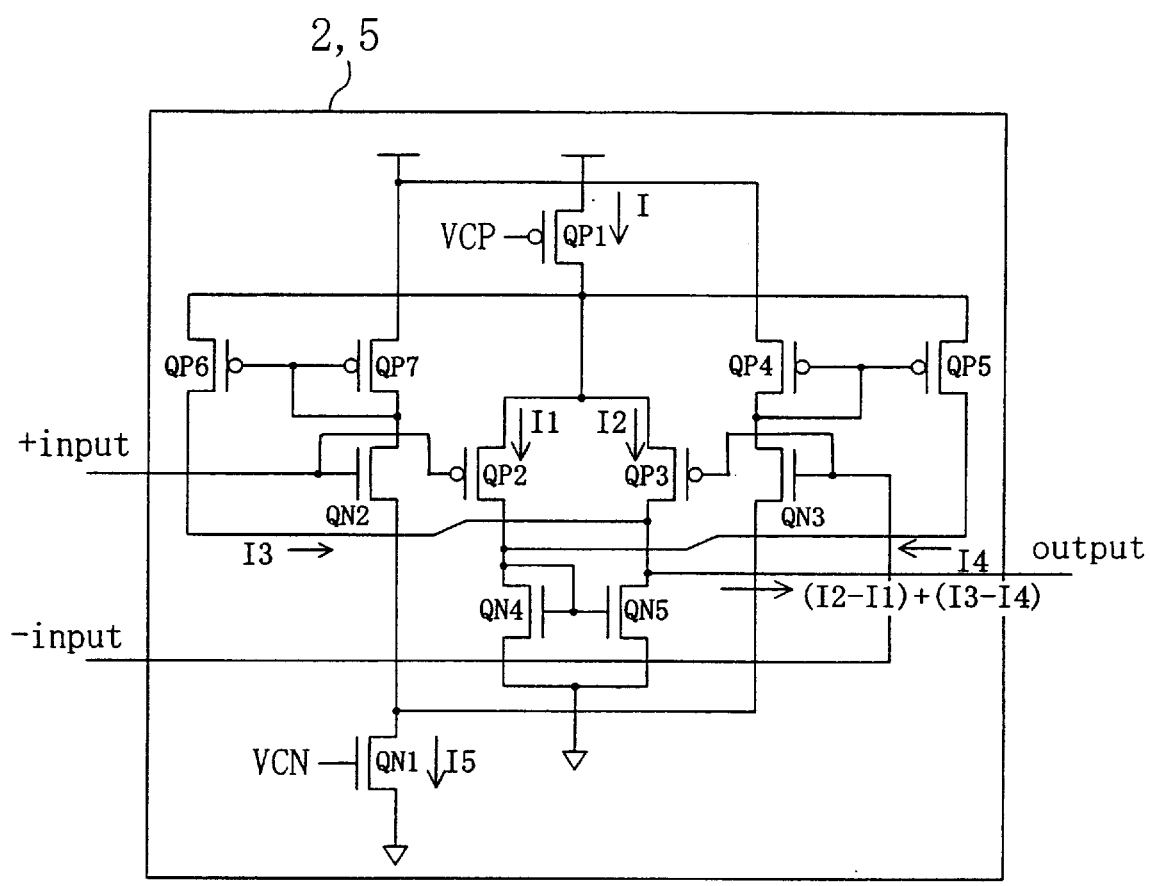
FIG. 3 illustrates a specific exemplary circuit configuration for the master and slave comparator circuits shown in FIG. 1.

FIG. 3 illustrates a specific exemplary circuit configuration for the master and slave comparator circuits 2 and 5 shown in FIG. 1. The circuit shown in FIG. 3 receives the differential signal (TX, XTX) with a center potential variable almost between the ground and supply voltages, and therefore receives the differential input at the parallel gates of p-channel transistors QP2 and QP3 and n-channel transistors QN2 and QN3.

In FIG. 3, the current flowing through the p-channel transistor QP2 receiving the non-inverted input at its gate is identified by I1. The current flowing through the p-channel transistor QP3 receiving the inverted input at its gate is identified by I2. The current flowing through the n-channel transistor QN2 (i.e., the current flowing through the p-channel transistor QP6 by way of a current mirror formed in part by QP7) receiving the non-inverted input at its gate is identified by I3. And the current flowing through the n-channel transistor QN3 (i.e., the current flowing through the p-channel transistor QP5 by way of another current mirror formed in part by QP4) receiving the inverted input at its gate is identified by I4. In this case, the output current is represented as $\{(I2-I1)+(I3-I4)\}$. That is to say, this output current is equivalent to the sensed current Icomp of the master comparator circuit 2 and to the offset current Ioffset of the slave comparator circuit 5. First, second and third pairs of transistors are made up of the p-channel transistors QP2 and QP3, n-channel transistors QN2 and QN3 and p-channel transistor QP5 and QP6, respectively.

The slave comparator circuit 5 for outputting the offset current Ioffset has totally the same configuration as the master comparator circuit 2 and includes the same input transistors QP2, QP3, QN2 and QN3, load circuit and current mirror circuits provided for the currents flowing through the input transistors. Accordingly, the sensed current Icomp of the master comparator circuit 2 and the offset current Ioffset of the slave comparator circuit 5 change similarly with a variation in potential of the differential input.

Also, the circuit configuration shown in FIG. 3 is highly resistant to the variation in potential of the differential input. As can be seen from FIG. 3, the sources of the transistors QP2, QP3, QP6 and QP5 making the currents I1, I2, I3 and I4 flow, respectively, are all connected to the drain of the p-channel transistor QP1 functioning as constant current source. Similarly, the sources of transistors QN2 and QN3 are coupled to the drain of transistor QN1 functioning as a constant current source, generating current I5. Accordingly, even if the potential represented by the differential input has changed, the total amount of currents I (=I1+I2+I3+I4) is kept constant.

Figure 4:
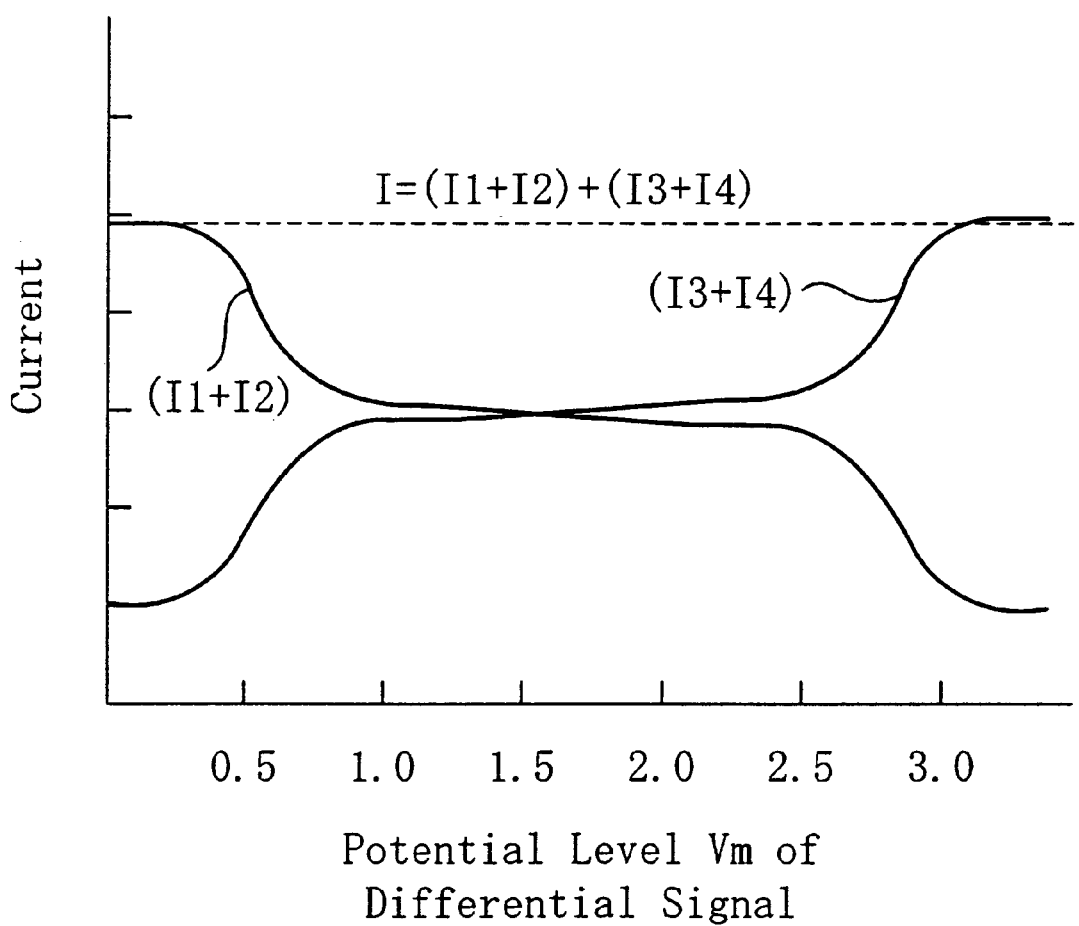
FIG. 4 is a graph illustrating a relationship between the current and differential input potential in the circuit shown in FIG. 3.

FIG. 4 is a graph illustrating a relationship between the potential represented by the differential signal (TX, XTX) (plotted as an intermediate potential Vm) and the respective currents flowing through the circuit shown in FIG. 3. As shown in FIG. 4, as the differential input potential decreases, the current (I1+I2) increases, but the current (I3+I4) decreases. On the other hand, as the differential input potential increases, the current (I1+I2) decreases, but the current (I3+I4) increases. Since the total amount I of currents is kept constant in this manner, the output currents Icomp and Ioffset are stabilized irrespective of the differential input potential. This is because if the differential input potential is low, then (I2−I1) increases, but (I3−I4) decreases. On the other hand, if the differential input potential is high, then (I3−I4) increases, but (I2−I1) decreases. That is to say, by supplying all the currents I1 through I4 from the common constant current source QP1, the sensed and offset currents Icomp and Ioffset can be stabilized against the variation in differential input potential.

Figure 5A:
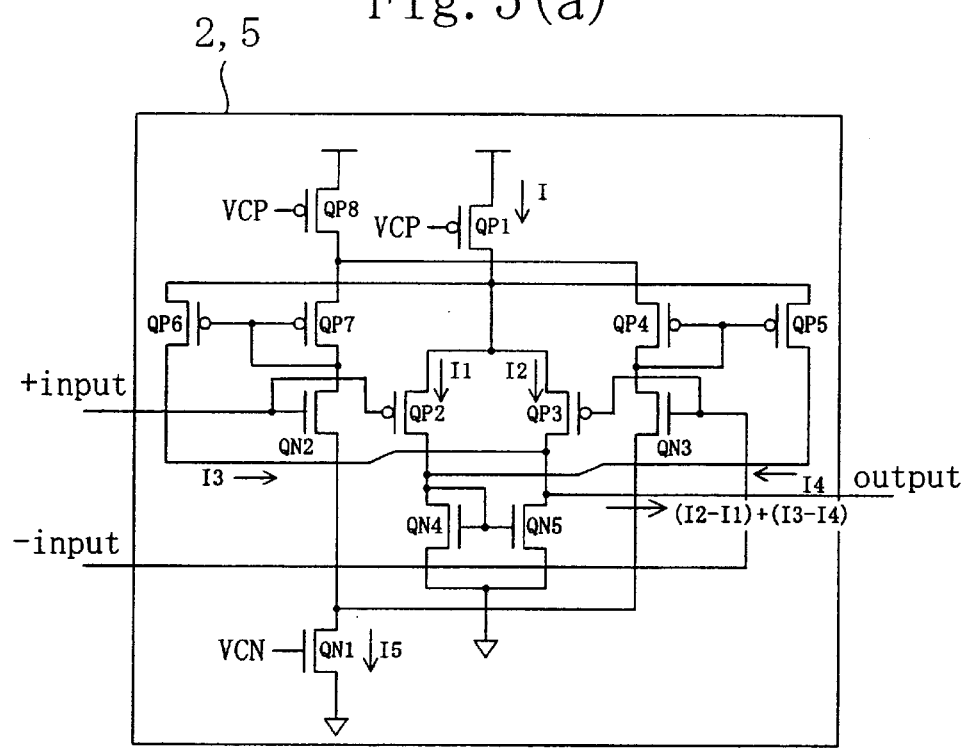
FIGS. 5(a) and 5(b) illustrate modified examples of the circuit shown in FIG. 3.
Figure 5B:
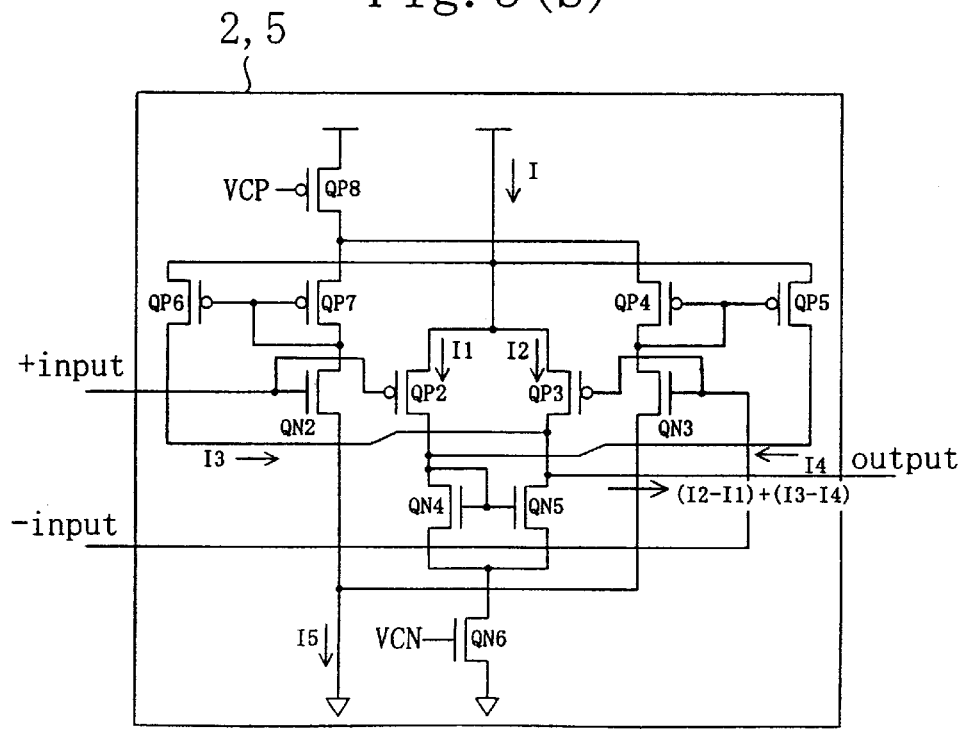

FIGS. 5(a) and 5(b) illustrate modified examples of the circuit shown in FIG. 3. In the modified example illustrated in FIG. 5(a), a transistor QP8 is additionally provided. On the other hand, in the modified example illustrated in FIG. 5(b), the transistors QP1 and QN1 are omitted but a transistor QN6 is additionally provided instead.

Figure 6:
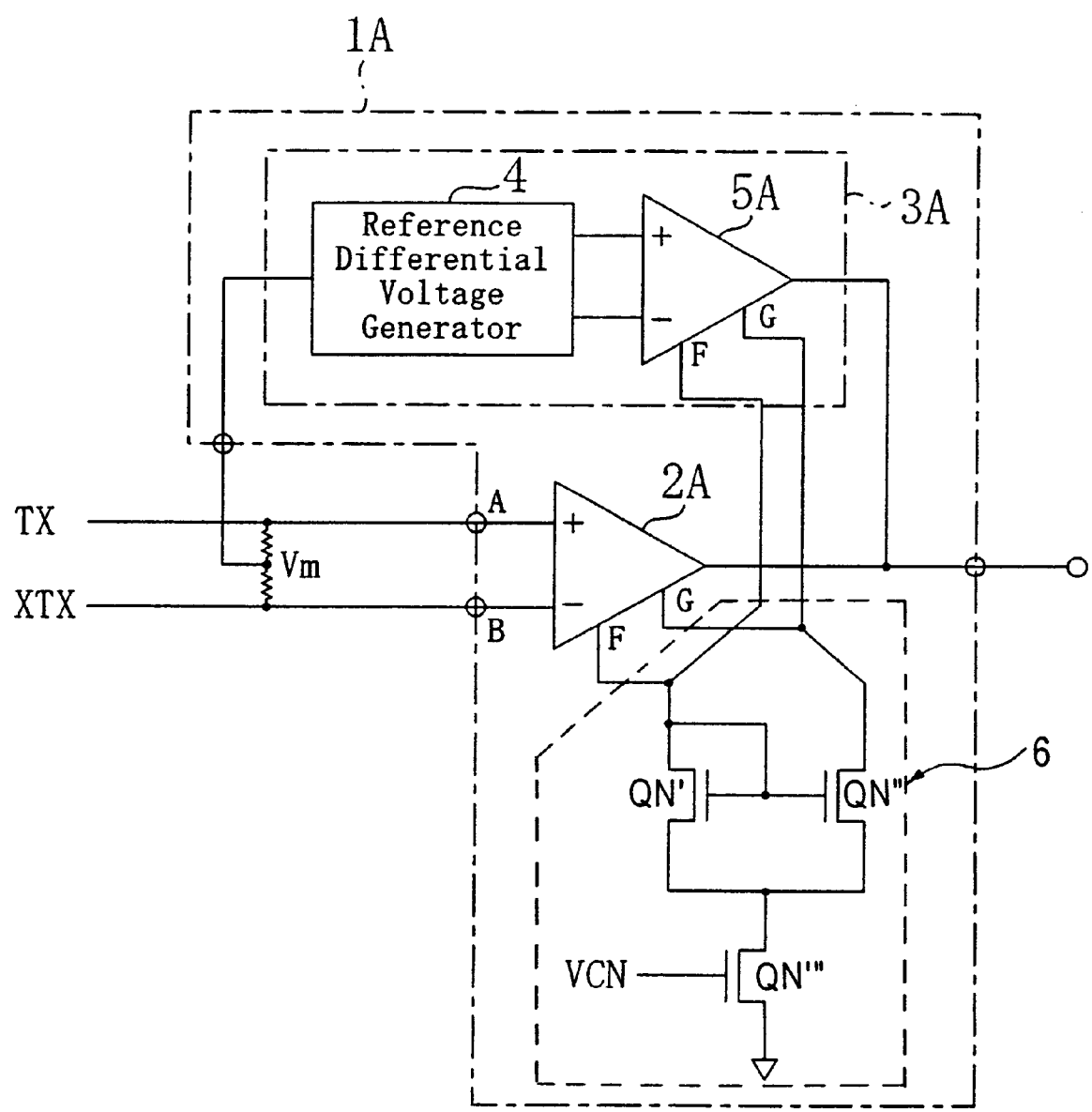
FIG. 6 illustrates a modified example of the offsetting comparator device according to the present invention.
Figure 7:
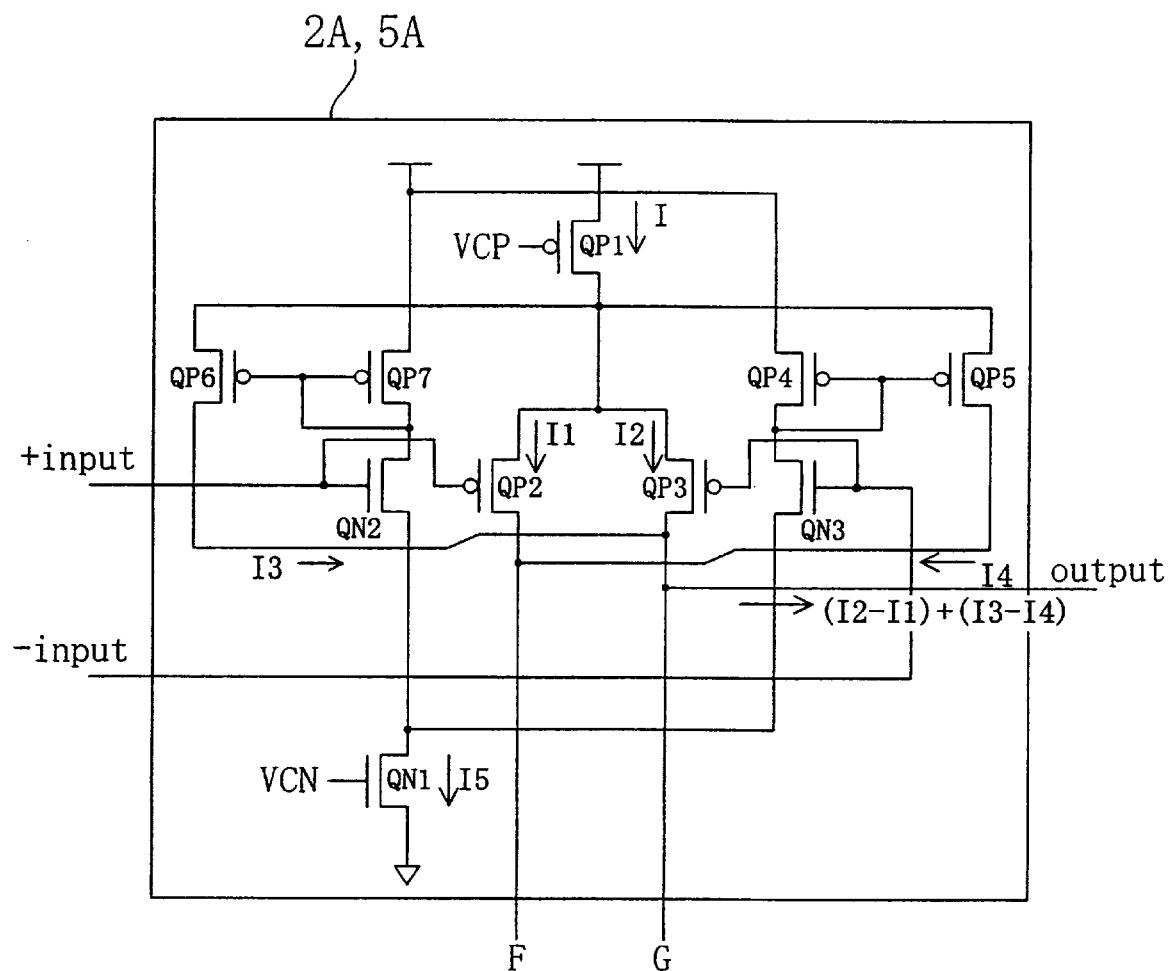
FIG. 7 illustrates a specific exemplary circuit configuration for the master and slave comparator circuits shown in FIG. 6.

FIG. 6 illustrates a modified example (reference as 1A) of the offsetting comparator device 1 shown in FIG. 1. In FIG. 6, a master comparator circuit 2A and a slave comparator circuit 5A partially share a circuit section reference generally as 6. Circuit section 6 functions as a current source for master and slave comparator circuits 2A and 5A, respectively, and includes n-channel transistors QN', QN" and QN'". A voltage source VCN is coupled to the gate of n-channel resistor QN'". FIG. 7 illustrates a specific exemplary circuit configuration for the master and slave comparator circuits 2A and 5A shown in FIG. 6.

Next, an exemplary specific configuration for the reference differential voltage generator 4 will be described. The reference differential voltage generator 4 generates a reference differential voltage (OFS, XOFS) in accordance with a variation in the intermediate potential Vm represented by the differential signal (TX, XTX). The reference differential voltage generator 4 is constructed such that the differential input potential applied to the master comparator circuit 2 is substantially equal to the center potential of the reference differential voltage (OFS, XOFS).

Figure 8A:
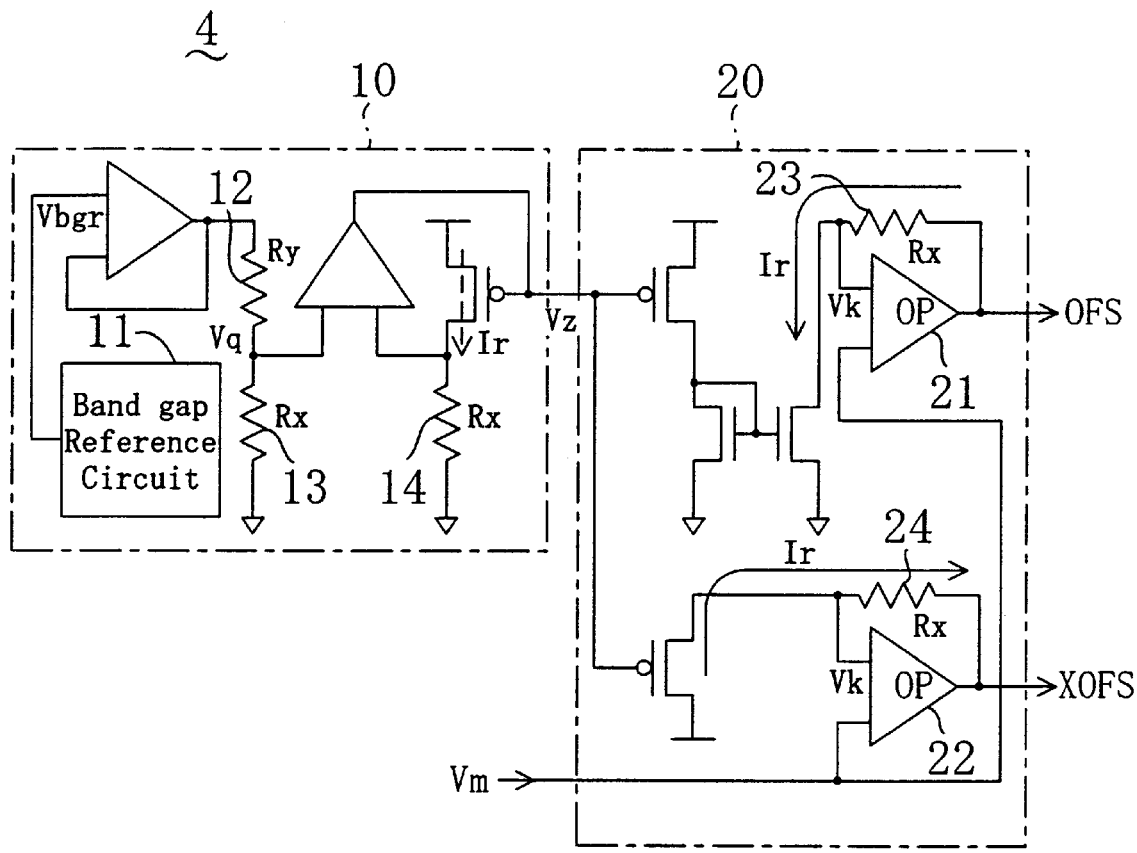
FIG. 8(a) illustrates an exemplary circuit configuration for the reference differential voltage generator.

FIG. 8(a) illustrates an exemplary circuit configuration for the reference differential voltage generator 4. As shown in FIG. 8(a), the reference differential voltage generator 4 includes a current controller 10 and a potential generator 20. The potential generator 20 includes first and second operational amplifiers 21 and 22, each of which receives the intermediate potential Vm represented by the differential signal (TX, XTX) at one of its input terminals. The other input terminal and the output terminal of the first operational amplifier 21 are connected together through a resistor 23, while the other input terminal and the output terminal of the second operational amplifier 22 are connected together through a resistor 24. A current Ir controlled by the current controller 10 flows through the resistors 23 and 24 in mutually opposite directions.

Figure 8B:
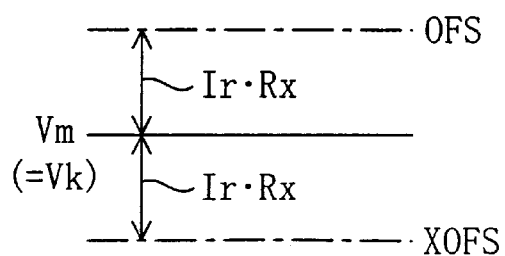
FIG. 8(b) illustrates a relationship between the intermediate potential of the differential signal and the reference differential voltage in the circuit shown in FIG. 8(a).

The outputs of the first and second operational amplifiers 21 and 22 are provided as the potentials OFS and XOFS of the reference differential voltage, respectively. That is to say, a potential higher than the intermediate potential Vm by the voltage drop caused by the resistor 23, i.e., (Ir·Rx), is generated as the potential OFS. On the other hand, a potential lower than the intermediate potential Vm by the voltage drop caused by the resistor 24, i.e., (Ir·Rx), is generated as the potential XOFS as shown in FIG. 8(b).

The current controller 10 controls the amount of the current Ir flowing in such a manner as to make the resistors 23 and 24 in the potential generator 20 cause a constant voltage drop. The current controller 10 includes a band gap reference circuit 11, which generates a reference voltage Vbgr that is constant almost independent of supply voltage or temperature change. As is found in any textbook of analog circuits, the band gap reference circuit 11 may be a combination of a diode and a resistor, which exhibit mutually opposite current variation characteristics with respect to a temperature change.

The reference voltage Vbgr generated by the band gap reference circuit 11 is divided using a pair of resistors 12 and 13, thereby generating a potential Vq. A current mirror circuit is provided within the current controller 10 to make the current Ir flow in such an amount as to obtain a potential equal to the potential Vq through the voltage drop caused by a resistor 14. Even if the resistance value Rx has changed, the current controller 10 can stabilize the voltage drops in the resistors 23 and 24 by controlling the current Ir.

Figure 9A:
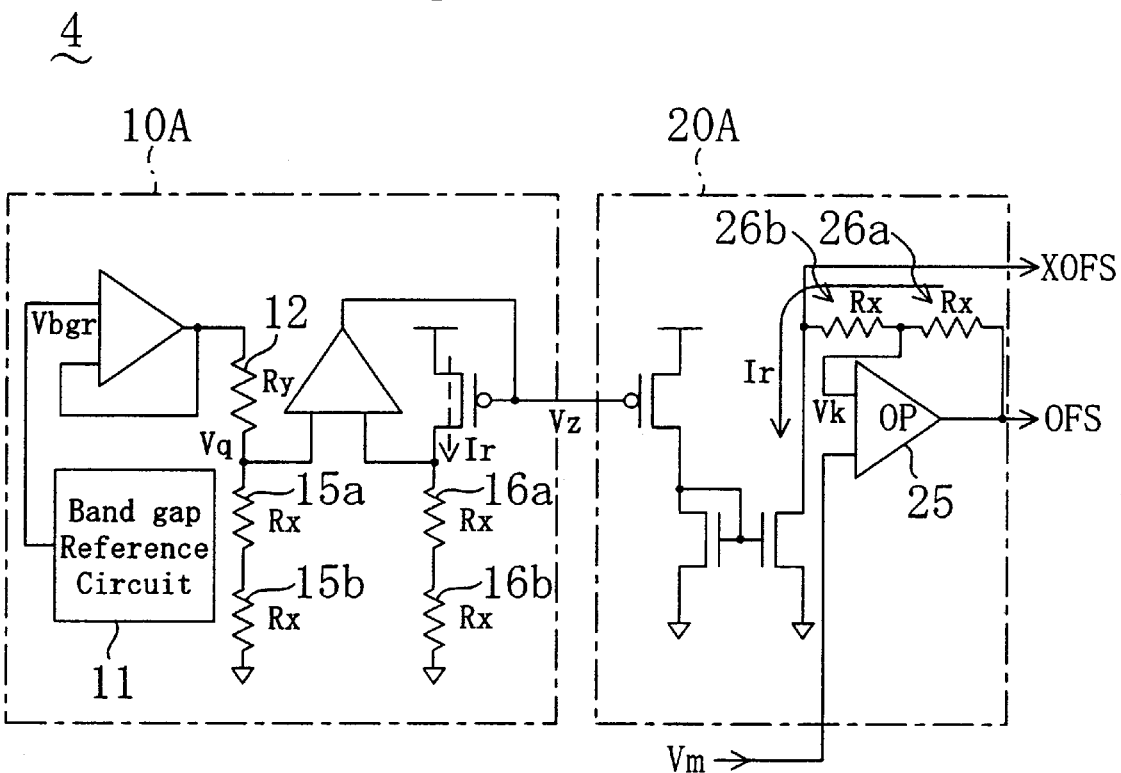
FIG. 9(a) illustrates another exemplary circuit configuration for the reference differential voltage generator.

FIG. 9(a) illustrates another exemplary circuit configuration for the reference differential voltage generator 4. As shown in FIG. 9(a), a potential generator 20A includes an operational amplifier 25, which receives the intermediate potential Vm represented by the differential signal (TX, XTX) at one of its input terminals. The other input terminal and the output terminal of the operational amplifier 25 are connected together through a resistor 26a, to which another resistor 26b is connected in series. A current Ir controlled by a current controller 10A flows through the serial connection of resistors 26a and 26b.

Figure 9B:
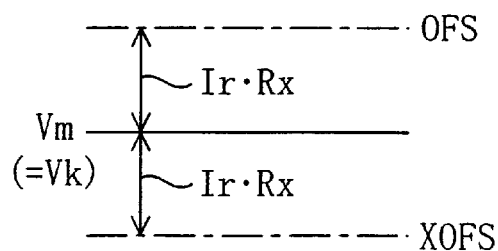
FIG. 9(b) illustrates a relationship between the intermediate potential of the differential signal and the reference differential voltage in the circuit shown in FIG. 9(a).

Potentials at both terminals of the serial connection of resistors 26a and 26b are output as the potentials OFS and XOFS of the reference differential voltage. That is to say, a potential higher than the intermediate potential Vm by the voltage drop caused by the resistor 26a, i.e., (Ir·Rx), is generated as the potential OFS. On the other hand, a potential lower than the intermediate potential Vm by the voltage drop caused by the resistor 26b, i.e., (Ir·Rx), is generated as the potential XOFS as shown in FIG. 9(b). In the configuration shown in FIG. 9(a), the number of operational amplifiers can be reduced by one compared to the configuration shown in FIG. 8(a).

The reference differential voltage generator 4 may have a configuration including no operational amplifiers operating at relatively low speeds.

Figure 10A:
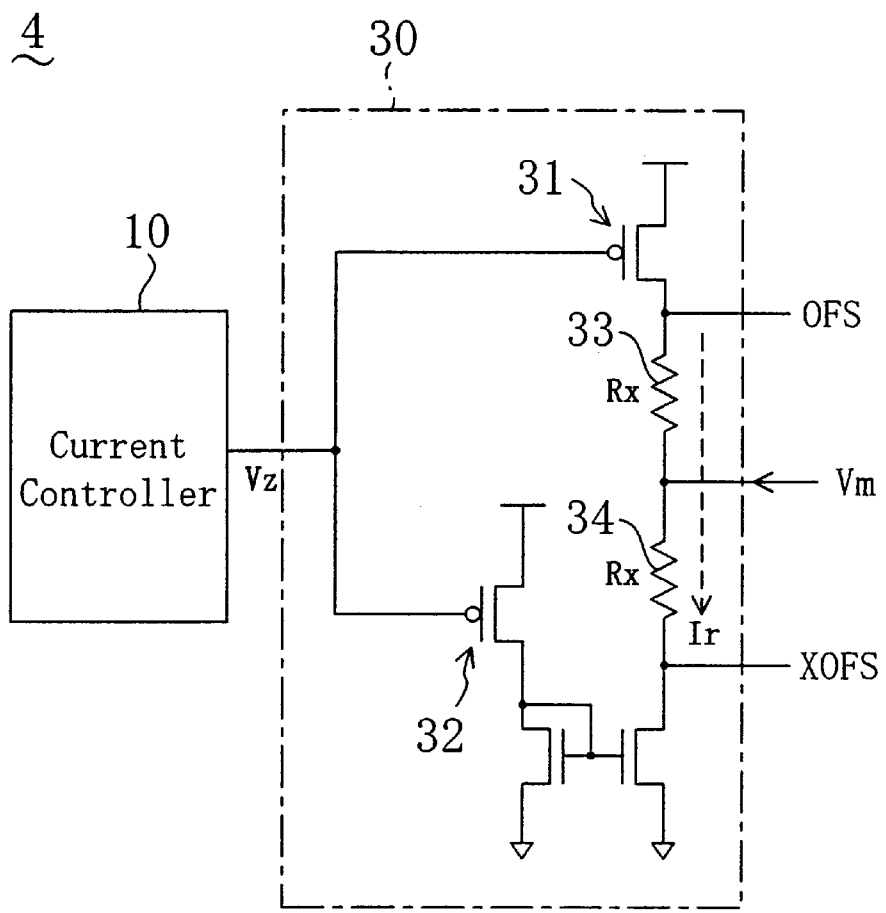
FIG. 10(a) illustrates still another exemplary circuit configuration for the reference differential voltage generator.

FIG. 10(a) illustrates still another exemplary circuit configuration for the reference differential voltage generator 4, in which no operational amplifiers are included. As shown in FIG. 10(a), a potential generator 30 includes first and second constant current circuits 31, 32 and resistors 33, 34 that are connected in series between the first and second constant current circuits 31, 32. The first constant current circuit 31 is implemented as p-channel transistor, which is controlled responsive to the output potential Vz of the current controller 10 for supplying a constant current Ir. The second constant current circuit 32 is implemented as current mirror circuit made up of another p-channel transistor and a pair of n-channel transistors, which are all controlled responsive to the output potential Vz of the current controller 10. The second constant current circuit 32 has the constant current Ir absorbed into a ground line by being controlled by the current controller 10.

Figure 10B:
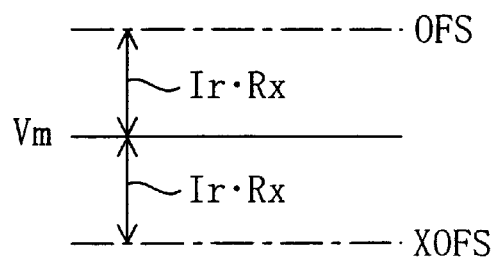
FIG. 10(b) illustrates a relationship between the intermediate potential of the differential signal and the reference differential voltage in the circuit shown in FIG. 10(a).

The current Ir controlled by the current controller 10 flows through the serial connection of resistors 33 and 34. The intermediate potential Vm represented by the differential signal (TX, XTX) is applied to the connection node between the resistors 33 and 34. The potentials at both terminals of this serial connection of resistors 33 and 34 are output as the potentials OFS and XOFS of the reference differential voltage. That is to say, a potential higher than the intermediate potential Vm by the voltage drop caused by the resistor 33, i.e., (Ir·Rx), is generated as the potential OFS. On the other hand, a potential lower than the intermediate potential Vm by the voltage drop caused by the resistor 34, i.e., (Ir·Rx), is generated as the potential XOFS as shown in FIG. 10(b).

The circuit shown in FIG. 10(a) includes no operational amplifiers and therefore can quickly catch up with the variation in intermediate potential Vm represented by the differential signal (TX, XTX). Accordingly, the configuration shown in FIG. 10(a) is applicable very suitably to a situation where a constant offset voltage should be obtained even though the intermediate potential Vm changes like an alternating current. In addition, the constant current Ir that has been supplied from the power supply by way of the first constant current circuit 31 is totally absorbed into the second constant current circuit 32. Thus, this circuit configuration does not affect the impedance characteristics of the transmission lines TX and XTX and does not make the intermediate potential Vm variable, either.

Figure 11A:
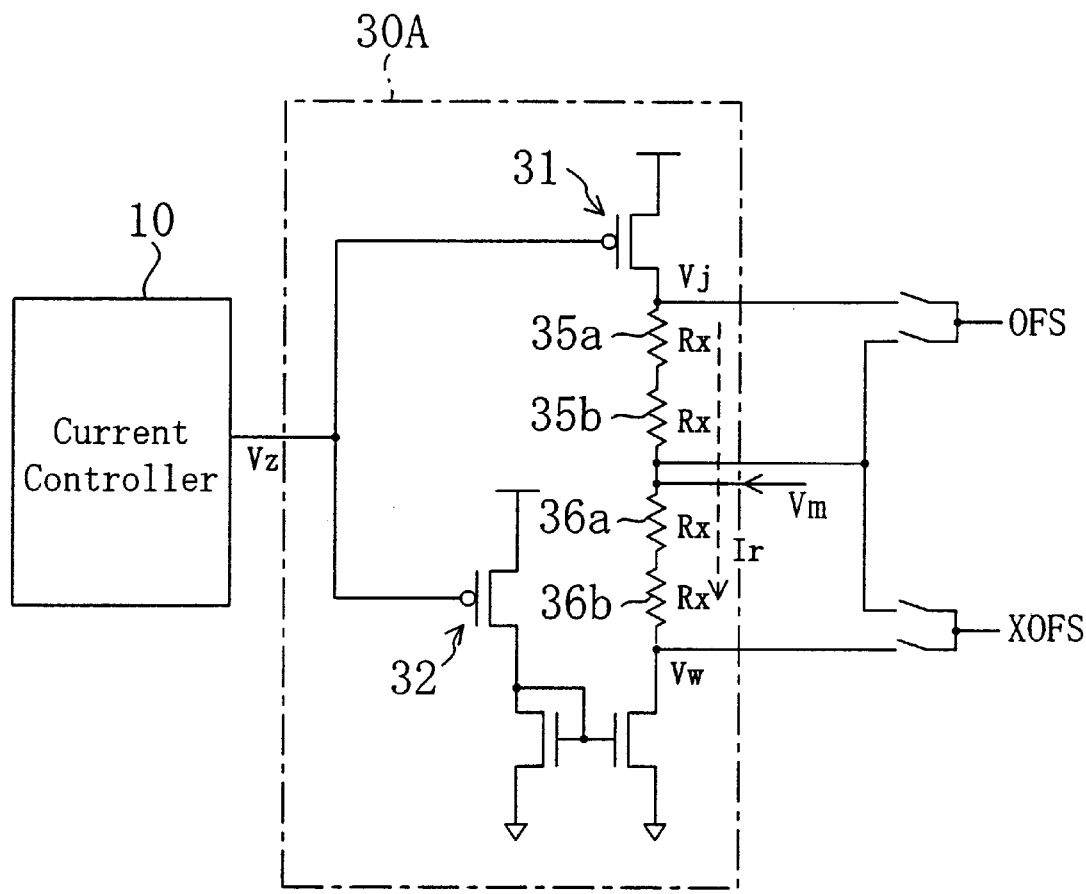
FIG. 11(a) illustrates yet another exemplary circuit configuration for the reference differential voltage generator.

FIG. 11(a) illustrates another exemplary circuit configuration for the reference differential voltage generator 4 including no operational amplifiers. This circuit configuration is applicable particularly effectively to a situation where the intermediate potential Vm represented by the differential signal (TX, XTX) is substantially equal to the supply or ground voltage and the first and second constant current circuits 31 and 32 cannot always operate stably enough.

In a potential generator 30A shown in FIG. 11(a), four resistors 35a, 35b, 36a and 36b are connected in series to each other between the first and second constant current circuits 31 and 32. The resistance value of the resistors 35a, 35b, 36a and 36b is equal to the resistance value Rx of the resistors 33 and 34 shown in FIG. 10(a). The intermediate potential Vm represented by the differential signal is applied to the connection node between the resistors 35b and 36a.

Figure 11B:
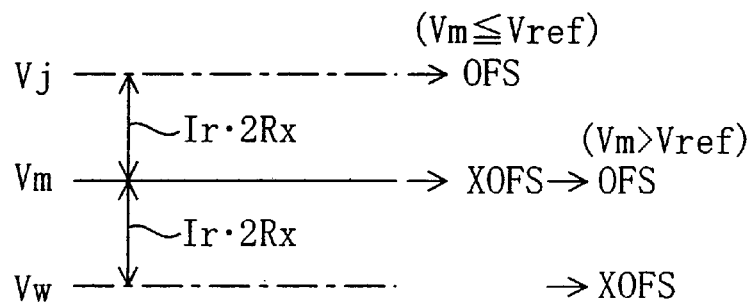
FIG. 11(b) illustrates a relationship between the intermediate potential of the differential signal and the reference differential voltage in the circuit shown in FIG. 11(a).

As shown in FIG. 11(b), the potential Vj at the upper terminal of the resistor 35a is higher than the intermediate potential Vm by the voltage drop caused by the resistors 35a and 35b, i.e., (Ir·2Rx). On the other hand, the potential Vw at the lower terminal of the resistor 36b is lower than the intermediate potential Vm by the voltage drop caused by the resistors 36a and 36b, i.e., (Ir·2Rx).

Thus, either-pair of potentials Vj and Vm or Vm and Vw is selectively output as the potentials OFS and XOFS of the reference differential voltage. This selection may be performed by a circuit separately provided for detecting the intermediate potential Vm represented by the differential signal (TX, XTX). For example, the pair of potentials Vj and Vm may be selected if the potential Vm is lower than a reference potential Vref (e.g., ½ VDD). Alternatively, the pair of potentials Vm and Vw may be selected if the potential Vm is higher than the reference potential Vref.

In each of the circuits shown in FIGS. 8 through 11, the potential generator includes at least two resistors, and the two potentials of the reference differential voltage are generated based on the intermediate potential represented by the differential input and on the voltage drops caused by these resistors. Also, the current controller controls the amount of current flowing through the resistors in the potential generator such that the voltage drops caused by the resistors become constant.

Figure 12A:
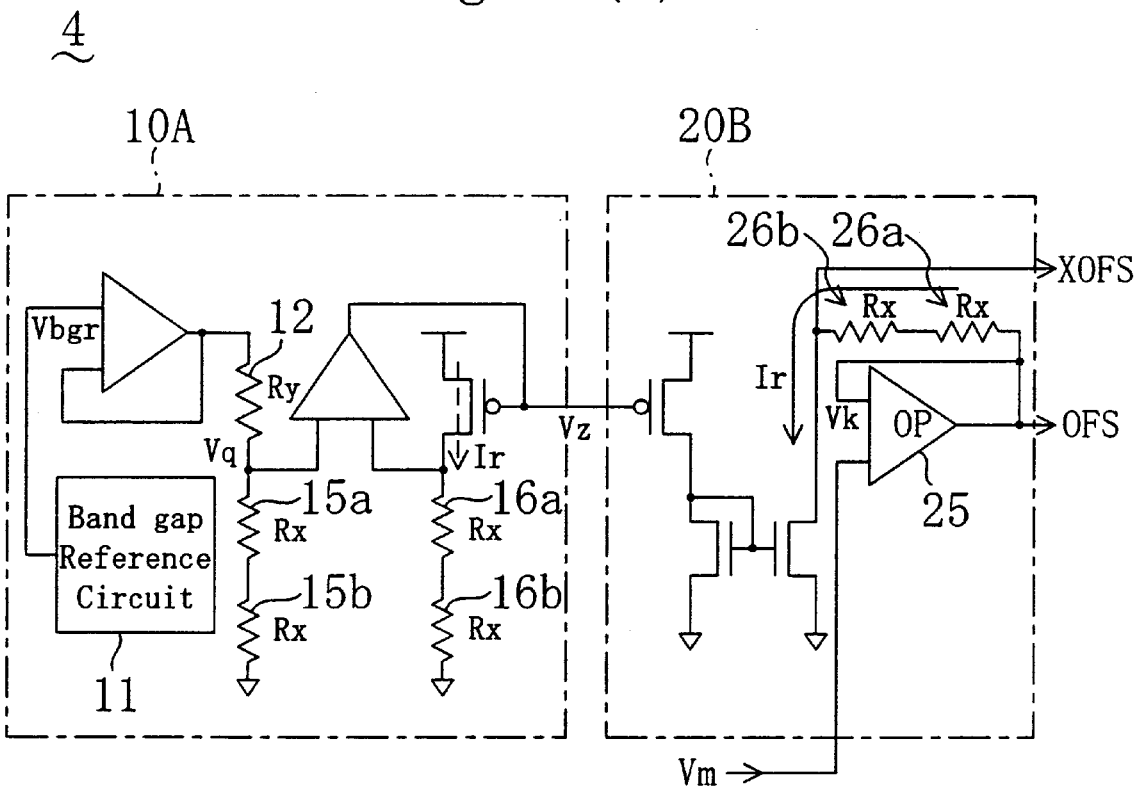
FIG. 12(a) illustrates yet another exemplary circuit configuration for the reference differential voltage generator.
Figure 12B:
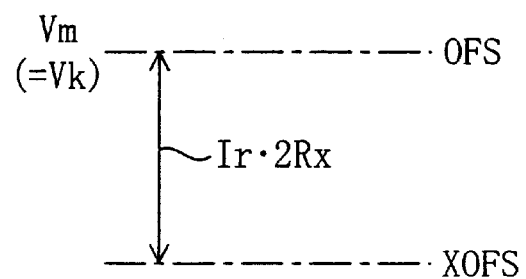
FIG. 12(b) illustrates a relationship between the intermediate potential of the differential signal and the reference differential voltage in the circuit shown in FIG. 12(a).

FIG. 12(a) illustrates yet another exemplary circuit configuration for the reference differential voltage generator 4. The circuit shown in FIG. 12(a) is the same as that illustrated in FIG. 9(a) except that one input terminal of the operational amplifier 25 is directly connected to the output terminal thereof without interposing the resistor 26a therebetween. Specifically, as shown in FIG. 12(b), a potential corresponding to the intermediate potential Vm is output from the potential generator 20B as the potential OFS of the reference differential voltage. And a potential, which is lower than the intermediate potential Vm by the voltage drop caused by the resistors 26a and 26b, i.e., (Ir·2Rx), is output as the potential XOFS from the potential generator 20B.

The configuration shown in FIG. 12(a) is applicable particularly effectively to a situation where the potential level represented by the differential signal (TX, XTX) has risen and the intermediate potential Vm has become closer to the supply potential Vcc. Specifically, if the intermediate potential Vm has become closer to the supply potential Vcc and the potential difference (Vcc−Vm) is smaller than (Ir·Rx), then the circuit shown in FIG. 9(a) cannot obtain a desired reference differential voltage. In contrast, according to the configuration shown in FIG. 12(a), even if the intermediate potential Vm is close to the supply potential Vcc, a desired reference differential voltage can be obtained.

Both the circuits shown in FIGS. 9(a) and 12(a) are ideally provided and one of them is selectively operated depending on the level of the intermediate potential Vm. Naturally, just one of them may be provided depending on the system to which the circuit is applied.

Figure 13:
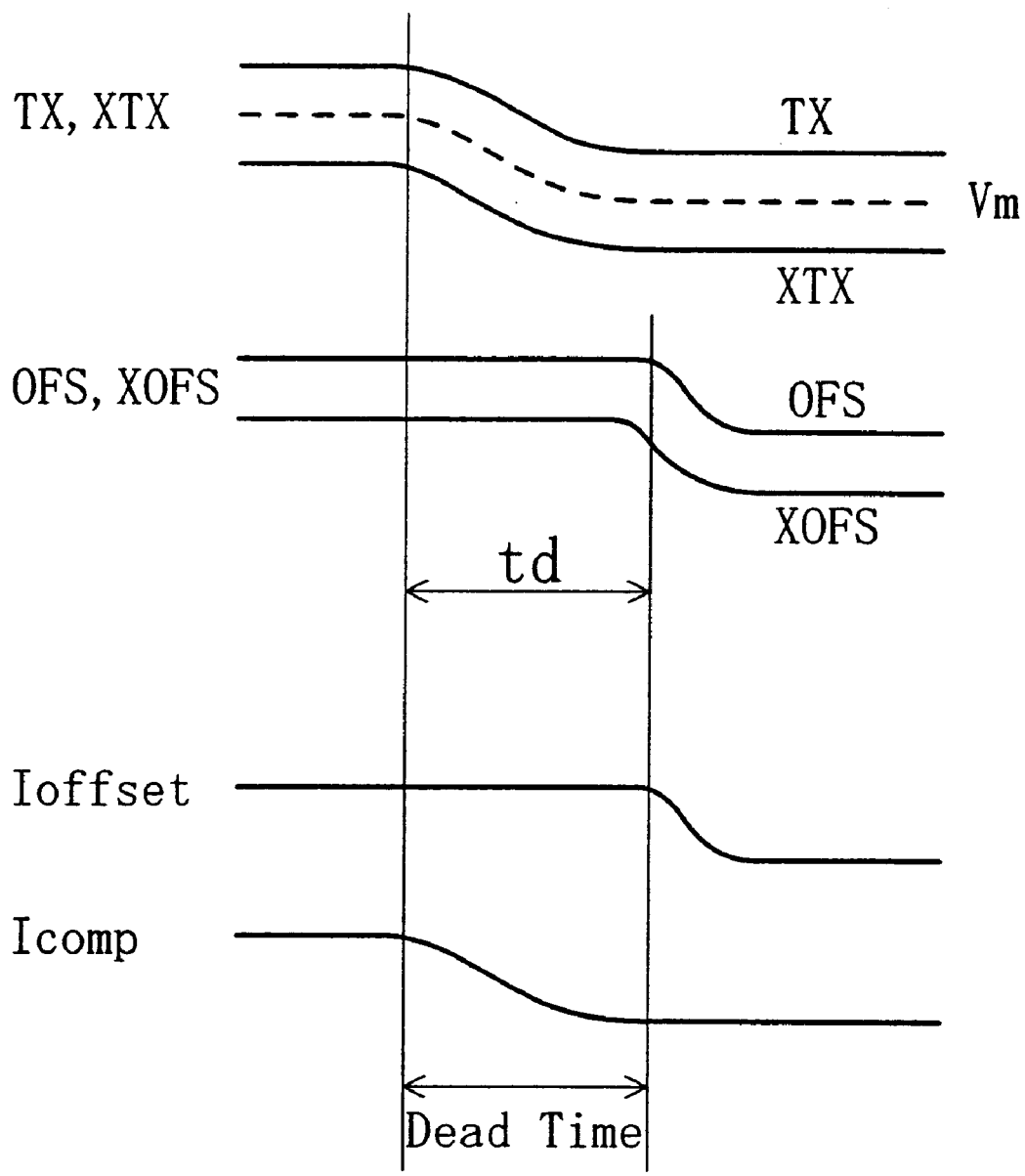
FIG. 13 illustrates a dead time resulting from a delay caused by the reference differential voltage generator.

If the intermediate potential Vm applied to the reference differential voltage generator 4 has changed, then the reference differential voltage generator 4 changes the level of the reference differential voltage (OFS, XOFS) a certain time later than the change of the potential Vm. Thus, if the potential level of the differential signal (TX, XTX) has changed, the change of the offset current Ioffset output from the slave comparator circuit 5 is delayed for a time td from the change of the sensed current Icomp output from the master comparator 2 as shown in FIG. 13. This delay td is caused by the reference differential voltage generator 4. That is to say, there is a dead time during which the relationship between the sensed and the offset currents Icomp and Ioffset is not ideal, thus possibly causing an erroneous operation.

Figure 14A:
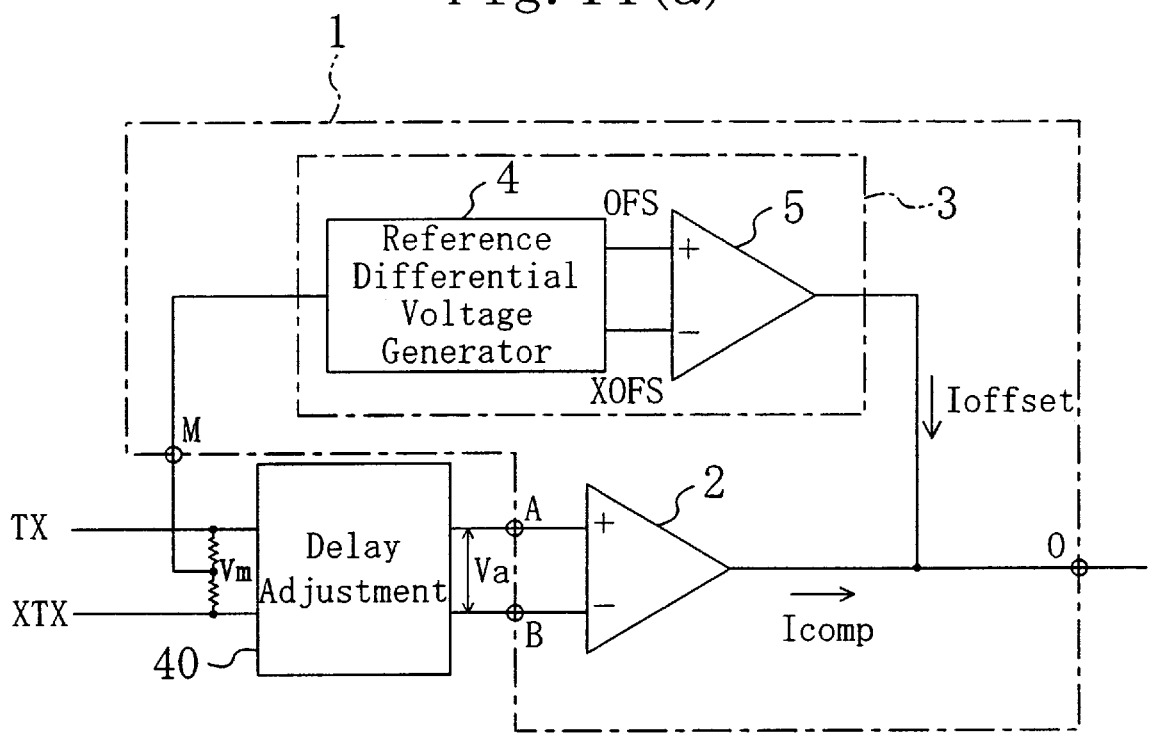
FIG. 14(a) illustrates an exemplary configuration for an offsetting comparator device including a delay adjustment circuit.
Figure 14B:
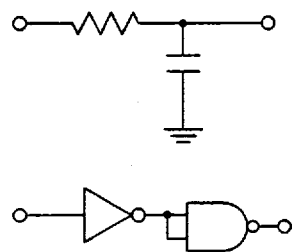
FIG. 14(b) illustrates an exemplary configuration for the delay adjustment circuit.
Figure 15:
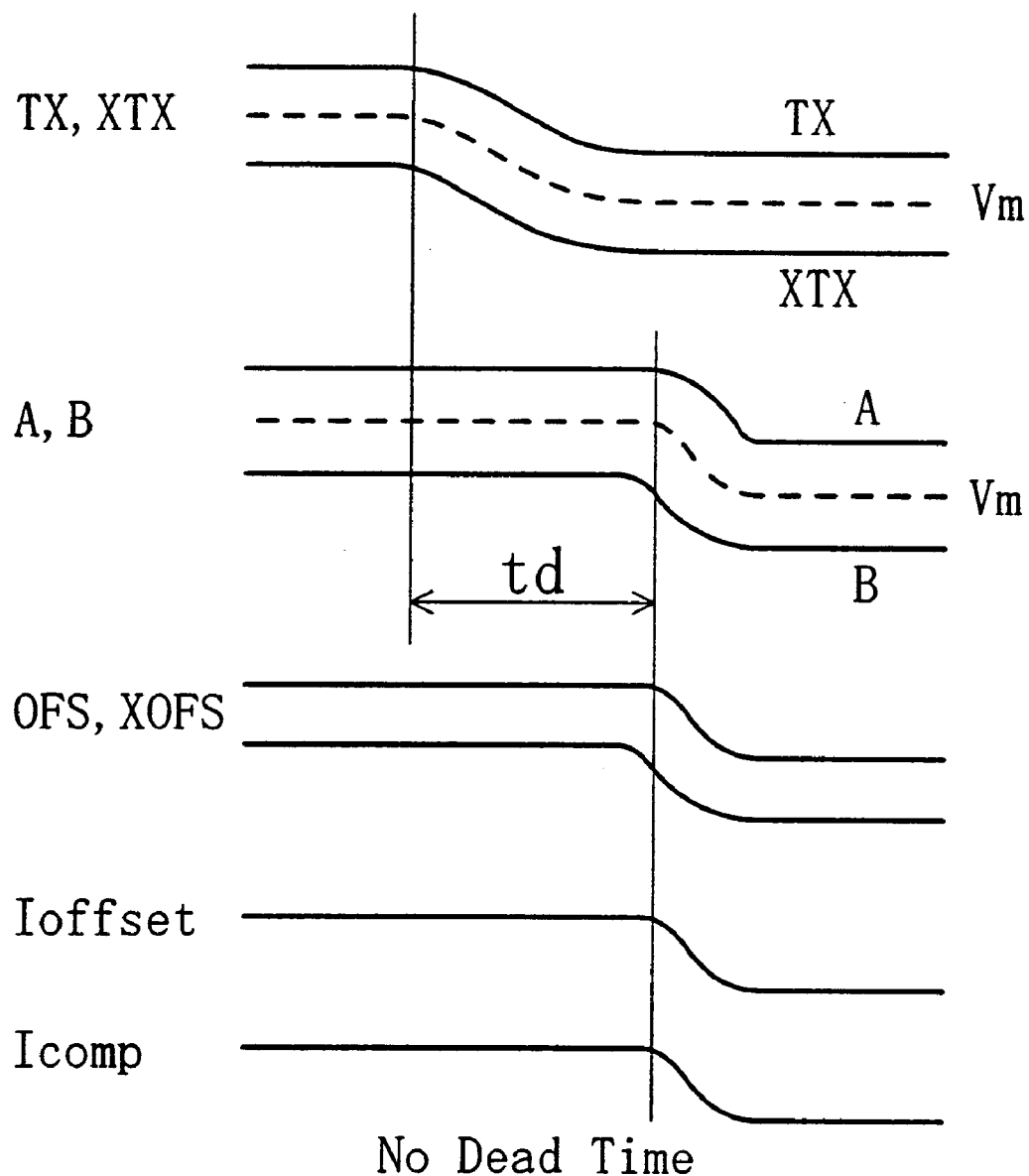
FIG. 15 illustrates how the delay adjustment circuit eliminates the dead time.

FIG. 14(a) illustrates an exemplary configuration for an offsetting comparator device including a delay adjustment circuit 40 to solve this problem. The delay adjustment circuit 40 adds substantially the same amount of delay as that td caused by the reference differential voltage generator 4 to the differential input to the master comparator circuit 2. The circuit 40 is implementable by a simple configuration such as that illustrated in FIG. 14(b). By providing the delay adjustment circuit 40 for the input end of the master comparator circuit 2, the arrival of the differential signal (TX, XTX) at the nodes A and B is delayed for the time td, thereby substantially eliminating the dead time as shown in FIG. 15. As a result, the erroneous operation can be avoided.

Figure 16A:
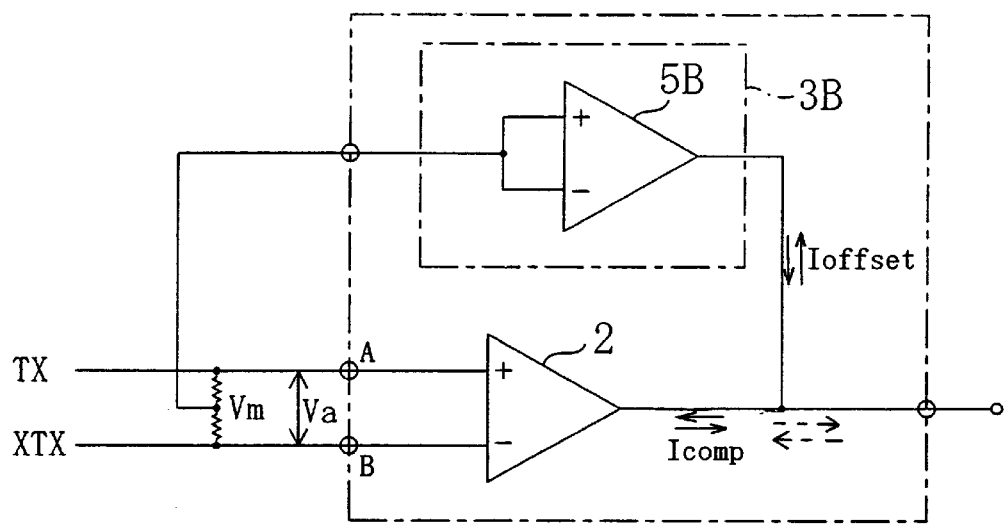
FIG. 16(a) illustrates an exemplary configuration for an offsetting comparator device according to another modified example of the present invention.

FIG. 16(a) illustrates an exemplary configuration for an offsetting comparator device according to another modified example of the present invention. In FIG. 16(a), offset current supply means 3B includes no reference differential voltage generator, but consists of a slave comparator circuit 5B alone. The intermediate potential Vm represented by the differential signal is applied to both the non-inverting and inverting input terminals of the slave comparator circuit 5B.

Figure 16B:
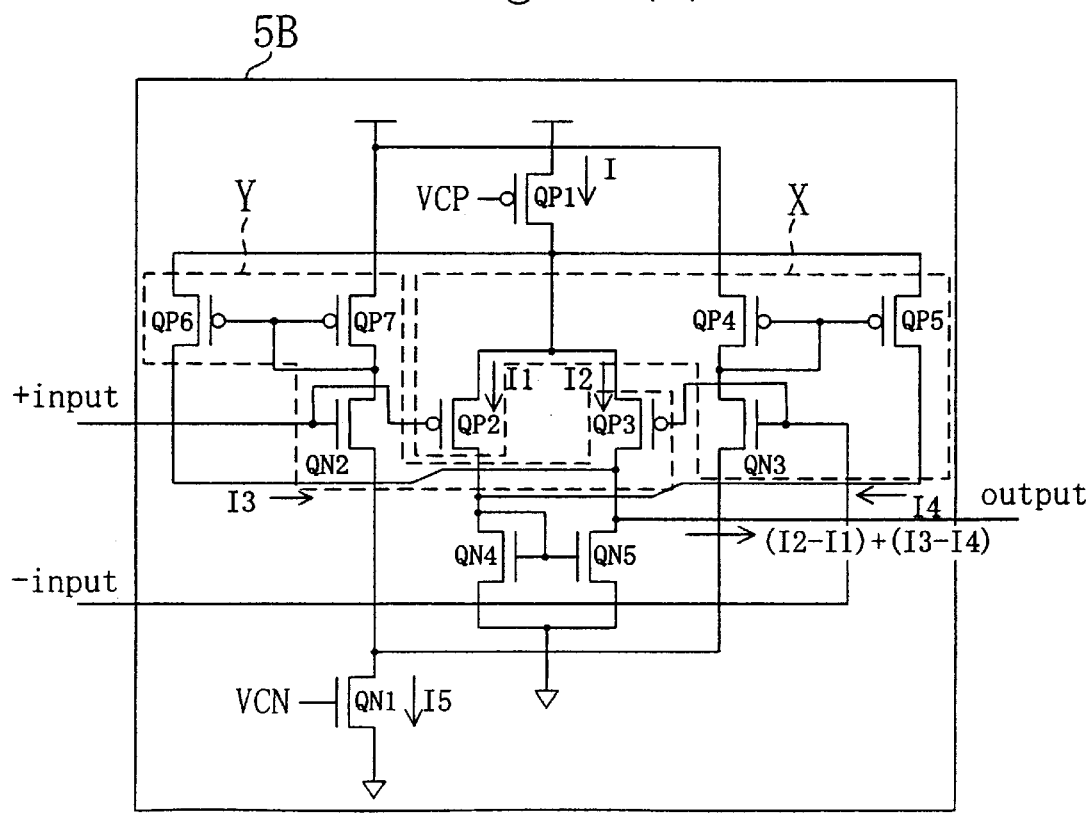
FIG. 16(b) illustrates an exemplary circuit configuration for the slave comparator circuit shown in FIG. 16(a).

FIG. 16(b) illustrates an exemplary circuit configuration for the slave comparator circuit 5B shown in FIG. 16(a). In FIG. 16(b), the operation characteristic of a set X of transistors QP2, QP4, QP5 and QN3 is asymmetric to that of another set Y of transistors QP3, QP6, QP7 and QN2. Accordingly, even if the same potential Vm is applied to both the non-inverting and inverting input terminals, the offset current Ioffset can still be generated. To make the operation characteristics asymmetric, the gate lengths or widths of transistors of these sets may be made different or the threshold voltage thereof may be changed by finely controlling the substrate potential.

Figure 17:
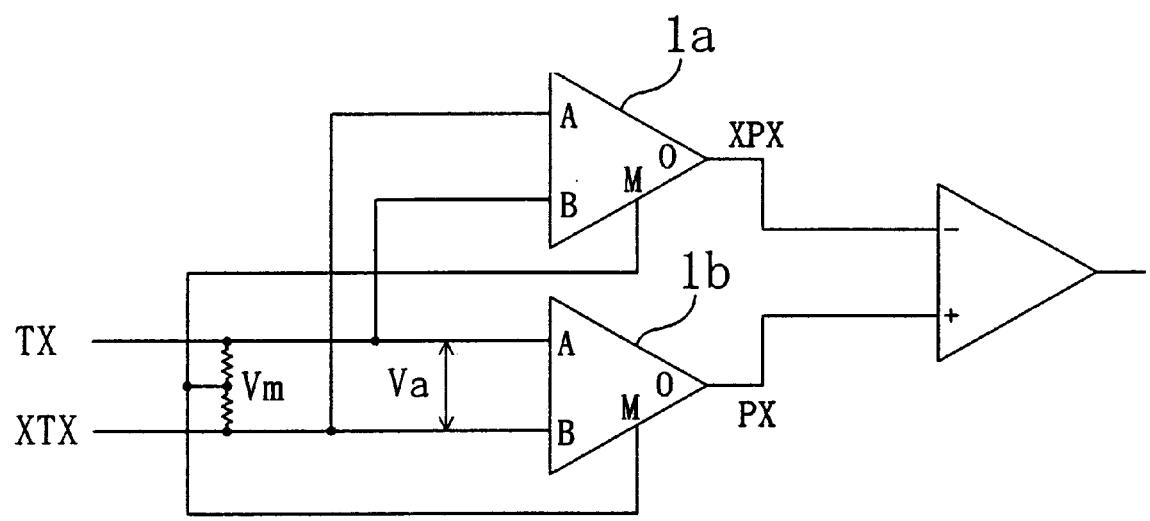
FIG. 17 illustrates an exemplary configuration of a system for performing tristate level determination of a differential signal on a transmission line, to which the offsetting comparator device of the present invention is applied.

FIG. 17 illustrates an exemplary configuration for a system performing tristate level determination of a differential signal on transmission lines TX and XTX, to which the offsetting comparator devices of the present invention are applied. In FIG. 17, the system includes the offsetting comparator devices 1a and 1b according to the present invention. The polarities of the differential inputs of the comparator device 1a are opposite to those of the differential inputs of the comparator device 1b.

Figure 18:
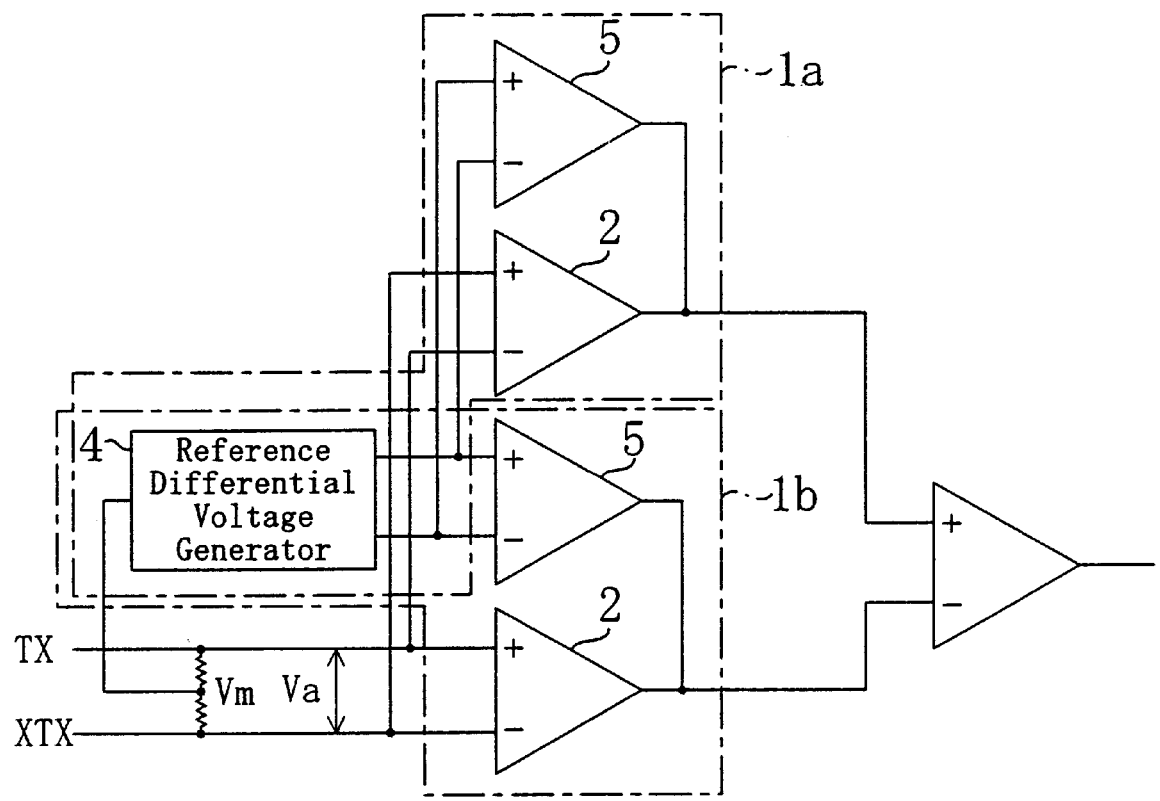
FIG. 18 illustrates a modified example of the system shown in FIG. 17.
Figure 19:
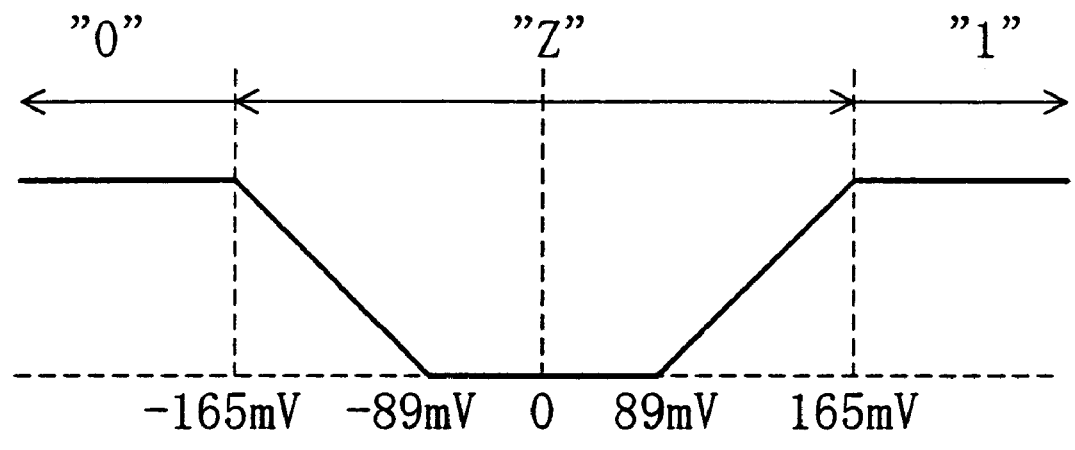
FIG. 19 illustrates tristate level determination of a differential signal according to the IEEE 1394 standard.

Also, as shown in FIG. 18, a single reference differential voltage generator 4 may be shared between the devices 1a and 1b.

As described above, even if the relationship between the potential difference represented by the differential signal and the sensed current has changed due to a variation in potential of the differential signal in the main comparator circuit, the offset voltage does not change according to the present invention. This is because the magnitude of the offset current is controlled based on the potential represented by the differential signal. As a result, it is possible to provide an offsetting comparator device that can obtain a constant offset voltage irrespective of the potential variation of the differential signal.

What is claimed is:

1. An offsetting comparator device for determining whether or not a potential difference represented by a differential signal has exceeded on offset voltage, the offsetting comparator device comprising:

a master comparator circuit which receives the differential signal as differential input and supplies a sensed current corresponding to the potential difference represented by the differential input; and offset current supply means for supplying an offset current, wherein the offsetting comparator device outputs a current representing a sum between the sensed and offset currents, the offset current supply means comprising:

a reference differential voltage generator which receives an intermediate potential, represented by the differential signal, as an input and outputs a reference differential voltage corresponding to the intermediate potential; and a slave comparator circuit which receives the reference differential voltage as differential input and outputs a current corresponding to the potential difference represented by the differential input as the offset current, the slave comparator circuit having the same configuration as the master comparator circuit, wherein each of the master and slave comparator circuits receives the associated differential input at respective parallel gates of p-channel and n-channel transistors, the reference differential voltage generator comprising:
a potential generator, which includes a resistor and generates both potentials represented by the reference differential voltage based on the intermediate potential and a voltage drop caused by the resistor; and a current controller for controlling the amount of current flowing through the resistor such that the voltage drop caused by the resistor becomes constant, the potential generator comprises an operational amplifier which receives the intermediate potential as one of the inputs, wherein the resistor connects the other input of the operational amplifier to the output thereof, and wherein the output of the operational amplifier is directly output as one of the potentials represented by the reference differential voltage.

2. The offsetting comparator device of claim 1, further comprising delaying means for delaying the differential signal for a predetermined time, the delaying means being provided on an input end of the master comparator circuit.

* * * * *